US011715696B2

United States Patent
Sheng et al.

(10) Patent No.: US 11,715,696 B2
(45) Date of Patent: Aug. 1, 2023

(54) SEMICONDUCTOR DEVICES WITH RECESSED PADS FOR DIE STACK INTERCONNECTIONS

(71) Applicant: Micron Technology, Inc., Boise, ID (US)

(72) Inventors: Ruei Ying Sheng, Taichung (TW); Andrew M. Bayless, Boise, ID (US); Brandon P. Wirz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 184 days.

(21) Appl. No.: 17/237,496

(22) Filed: Apr. 22, 2021

(65) Prior Publication Data

US 2022/0344270 A1 Oct. 27, 2022

(51) Int. Cl.
*H01L 23/538* (2006.01)
*H01L 25/065* (2023.01)
*H01L 21/768* (2006.01)
*H01L 21/48* (2006.01)
*H01L 21/50* (2006.01)

(52) U.S. Cl.
CPC ........ *H01L 23/5384* (2013.01); *H01L 21/486* (2013.01); *H01L 21/50* (2013.01); *H01L 21/76802* (2013.01); *H01L 21/76877* (2013.01); *H01L 23/5386* (2013.01); *H01L 25/0657* (2013.01)

(58) Field of Classification Search
CPC .......... H01L 23/5384; H01L 21/76802; H01L 21/76877; H01L 23/53228; H01L 23/5381; H01L 23/5386; H01L 25/0657
See application file for complete search history.

(56) References Cited

U.S. PATENT DOCUMENTS

| 6,727,116 B2 * | 4/2004 | Poo ...................... H01L 25/105 438/678 |
| 7,585,750 B2 * | 9/2009 | Do ......................... H01L 24/24 257/E21.211 |
| 7,605,457 B2 * | 10/2009 | Hoshino ................. H01L 25/50 257/777 |
| 7,863,722 B2 * | 1/2011 | Chua ..................... H01L 21/561 438/109 |

(Continued)

*Primary Examiner* — Bac H Au
(74) *Attorney, Agent, or Firm* — Perkins Coie LLP

(57) ABSTRACT

Semiconductor devices having electrical interconnections through vertically stacked semiconductor dies, and associated systems and methods, are disclosed herein. In some embodiments, a semiconductor assembly includes a die stack having a plurality of semiconductor dies. Each semiconductor die can include surfaces having an insulating material, a recess formed in at least one surface, and a conductive pad within the recess. The semiconductor dies can be directly coupled to each other via the insulating material. The semiconductor assembly can further include an interconnect structure electrically coupled to each of the semiconductor dies. The interconnect structure can include a monolithic via extending continuously through each of the semiconductor dies in the die stack. The interconnect structure can also include a plurality of protrusions extending from the monolithic via. Each protrusion can be positioned within the recess of a respective semiconductor die and can be electrically coupled to the conductive pad within the recess.

12 Claims, 9 Drawing Sheets

(56) References Cited

U.S. PATENT DOCUMENTS

| | | | | |
|---|---|---|---|---|
| 11,201,140 B2* | 12/2021 | Choi | ............... | H01L 25/50 |
| 2003/0232488 A1* | 12/2003 | Chua | ............... | H01L 21/76898 |
| | | | | 257/E21.597 |
| 2004/0207049 A1* | 10/2004 | Bauer | ............... | H01L 23/3185 |
| | | | | 438/113 |
| 2009/0032960 A1* | 2/2009 | Pratt | ............... | H01L 25/50 |
| | | | | 438/618 |
| 2010/0270668 A1* | 10/2010 | Marcoux | ............... | H01L 25/0657 |
| | | | | 257/E21.546 |
| 2013/0037939 A1* | 2/2013 | Lee | ............... | H01L 23/3171 |
| | | | | 257/737 |
| 2013/0341803 A1* | 12/2013 | Cheah | ............... | H01L 24/16 |
| | | | | 257/774 |
| 2015/0200163 A1* | 7/2015 | Lin | ............... | H01L 23/5384 |
| | | | | 257/621 |
| 2019/0198443 A1* | 6/2019 | Nakano | ............... | H05K 1/115 |
| 2020/0395304 A1* | 12/2020 | Chen | ............... | H01L 23/5386 |
| 2020/0402960 A1* | 12/2020 | Chen | ............... | H01L 23/3121 |
| 2021/0159178 A1* | 5/2021 | Nam | ............... | H01L 23/373 |
| 2021/0193622 A1* | 6/2021 | Choi | ............... | H01L 23/5384 |
| 2021/0280563 A1* | 9/2021 | Wu | ............... | H01L 25/50 |
| 2021/0398929 A1* | 12/2021 | Kim | ............... | H01L 23/3157 |
| 2022/0157740 A1* | 5/2022 | Verhaverbeke | ............... | H01L 25/0657 |
| 2022/0181299 A1* | 6/2022 | Kim | ............... | H01L 29/0684 |
| 2022/0208682 A1* | 6/2022 | Son | ............... | H01L 25/0657 |
| 2022/0301890 A1* | 9/2022 | Chen | ............... | H01L 23/31 |
| 2022/0302082 A1* | 9/2022 | Liang | ............... | H01L 23/5386 |
| 2022/0320045 A1* | 10/2022 | Chang | ............... | H01L 23/5385 |

* cited by examiner

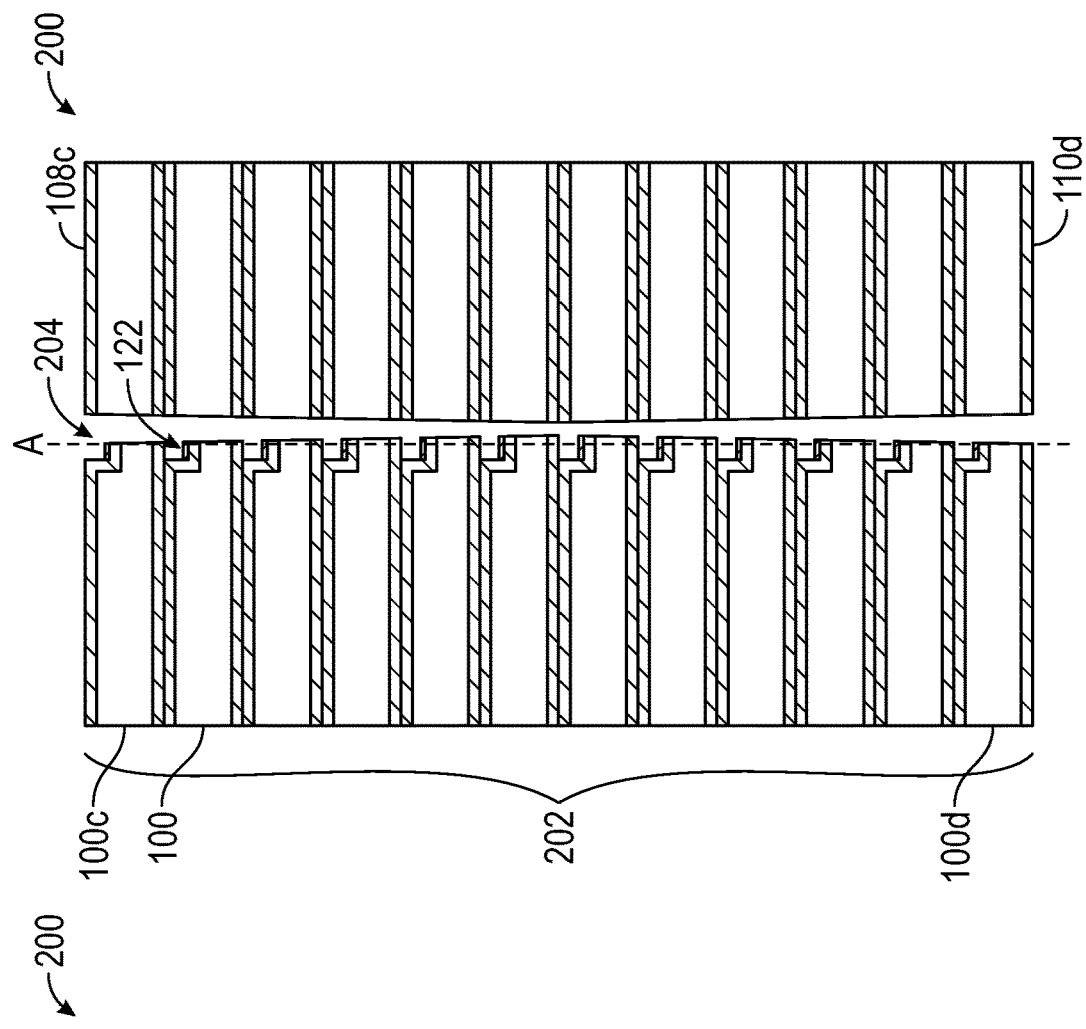
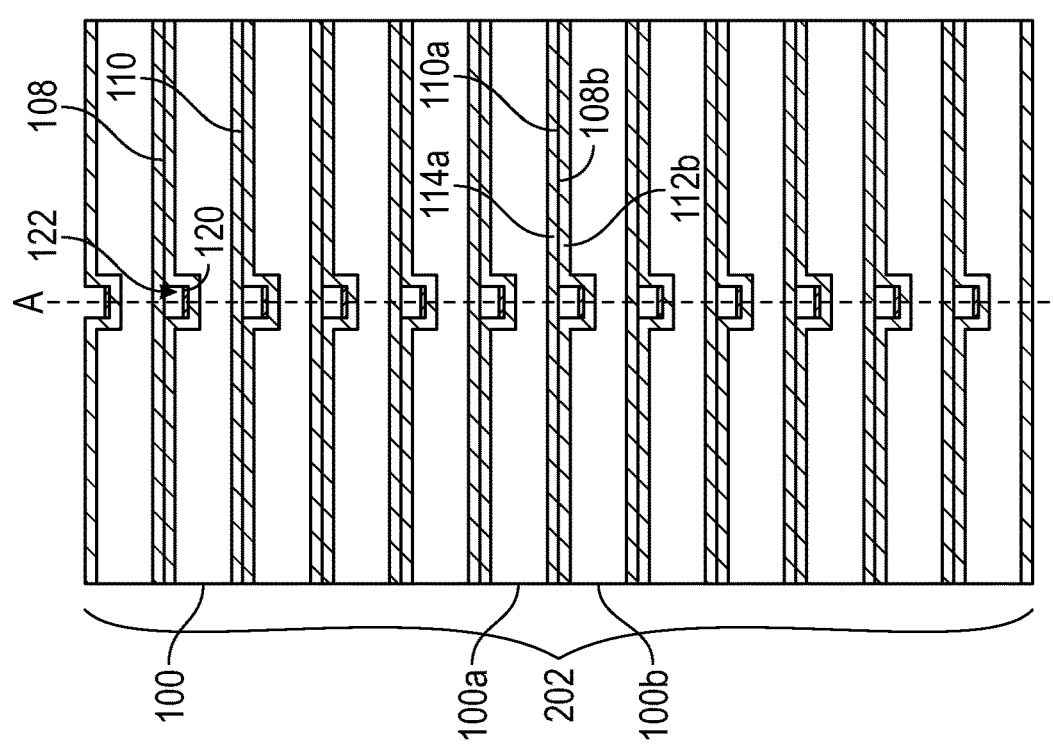

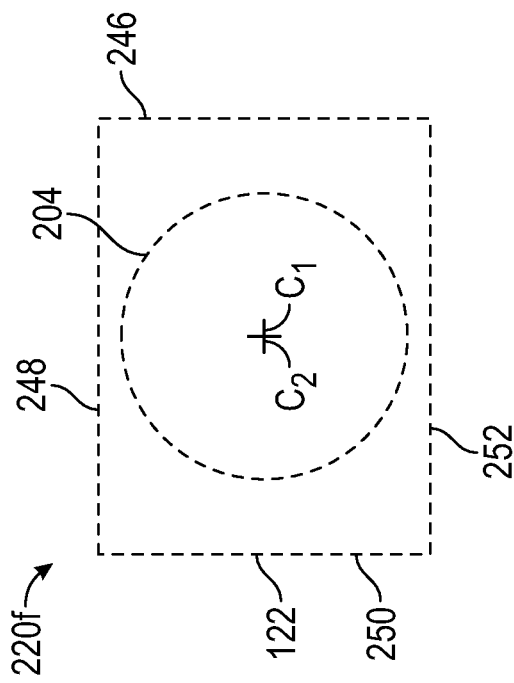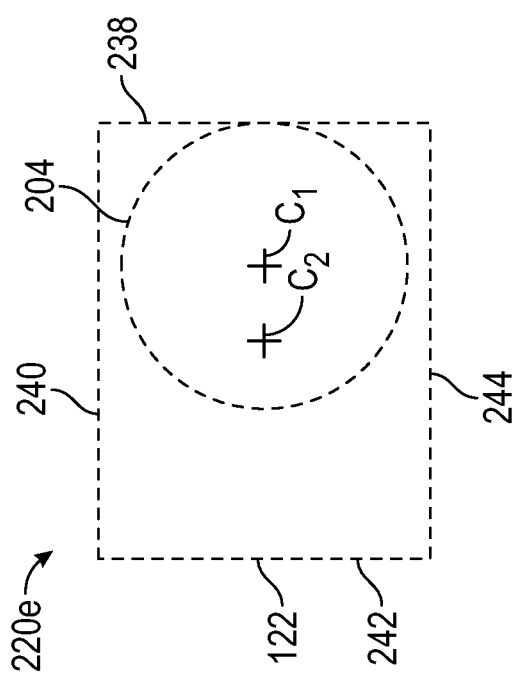

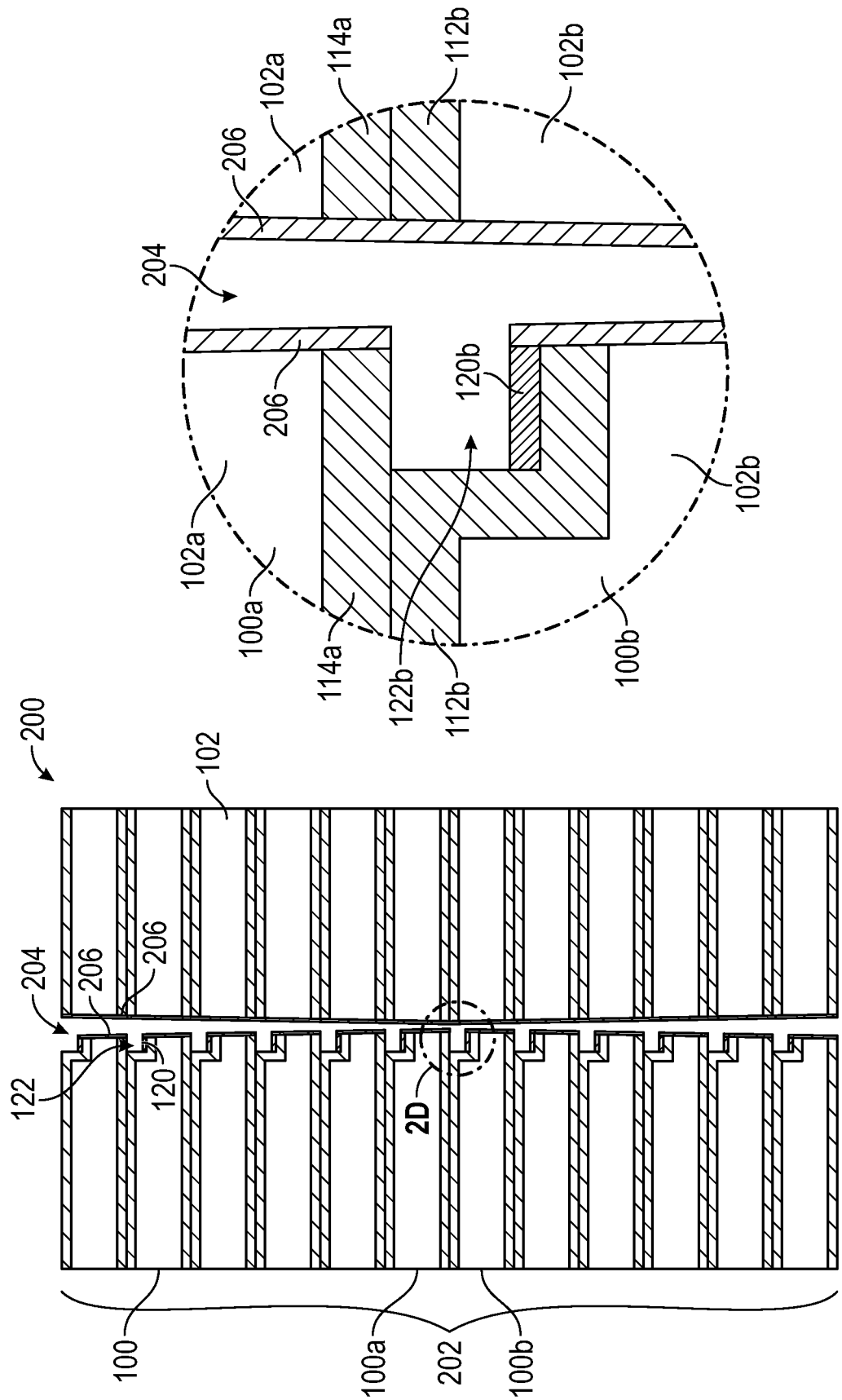

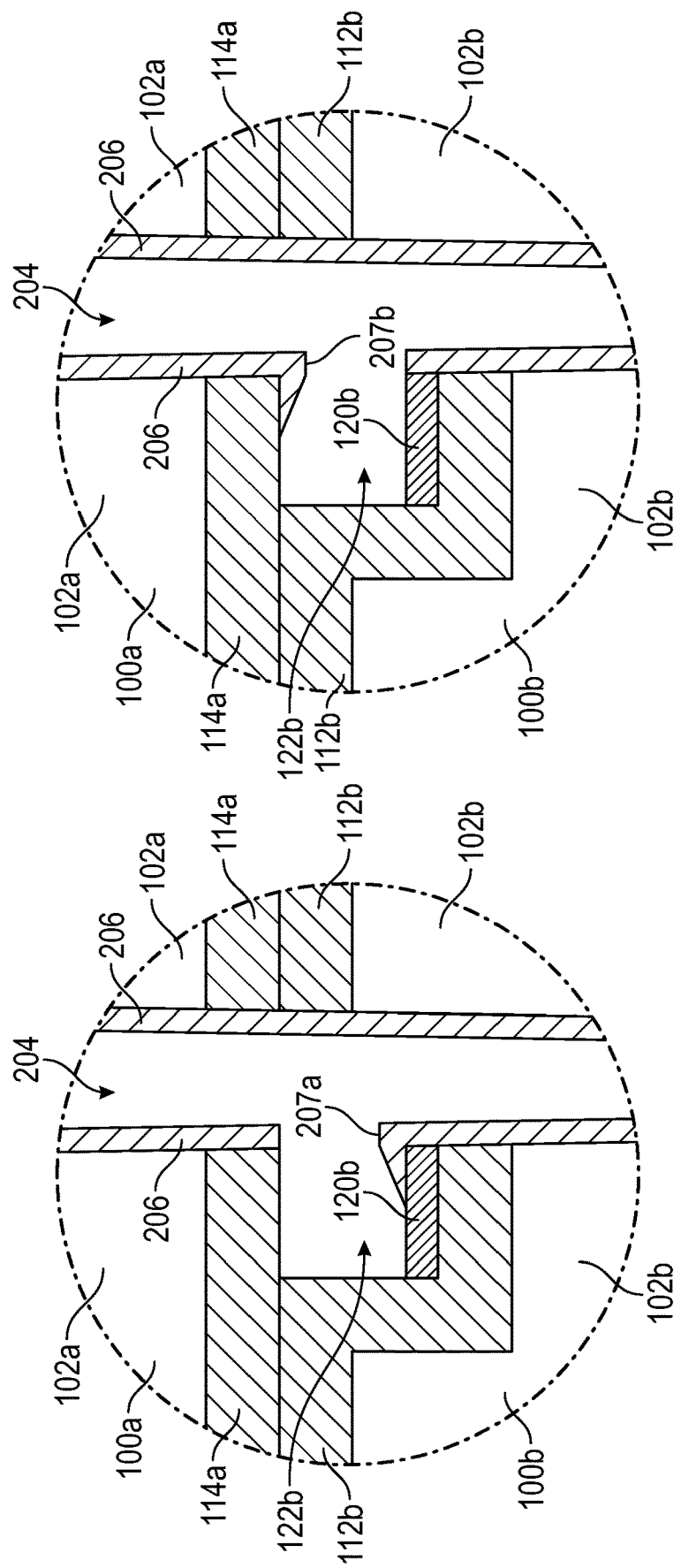

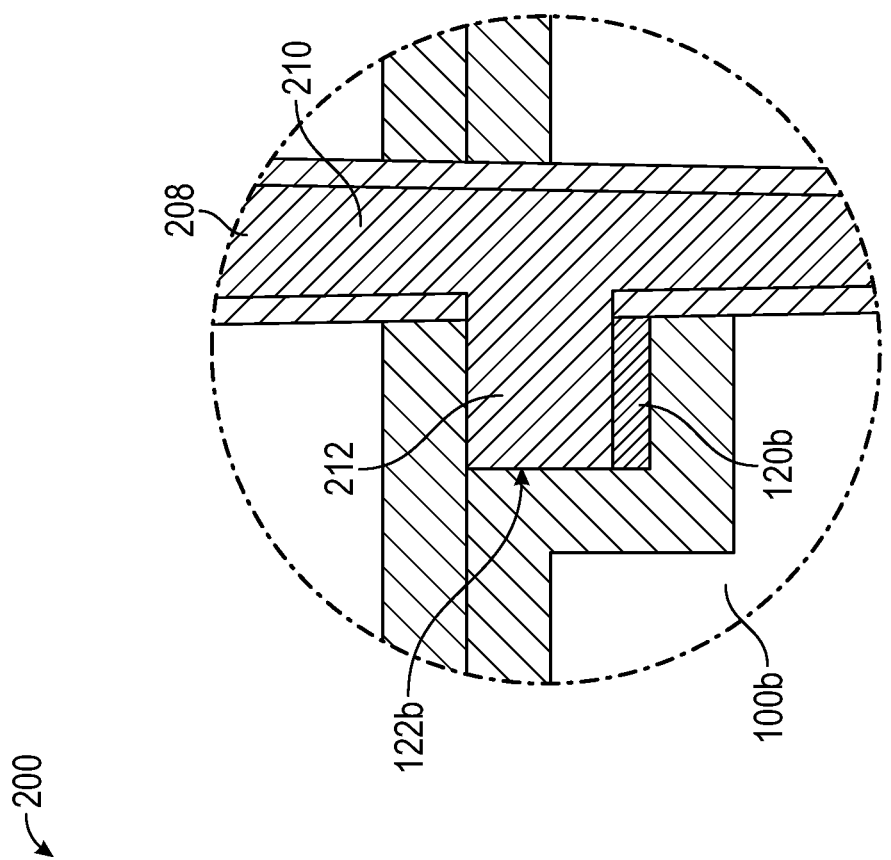
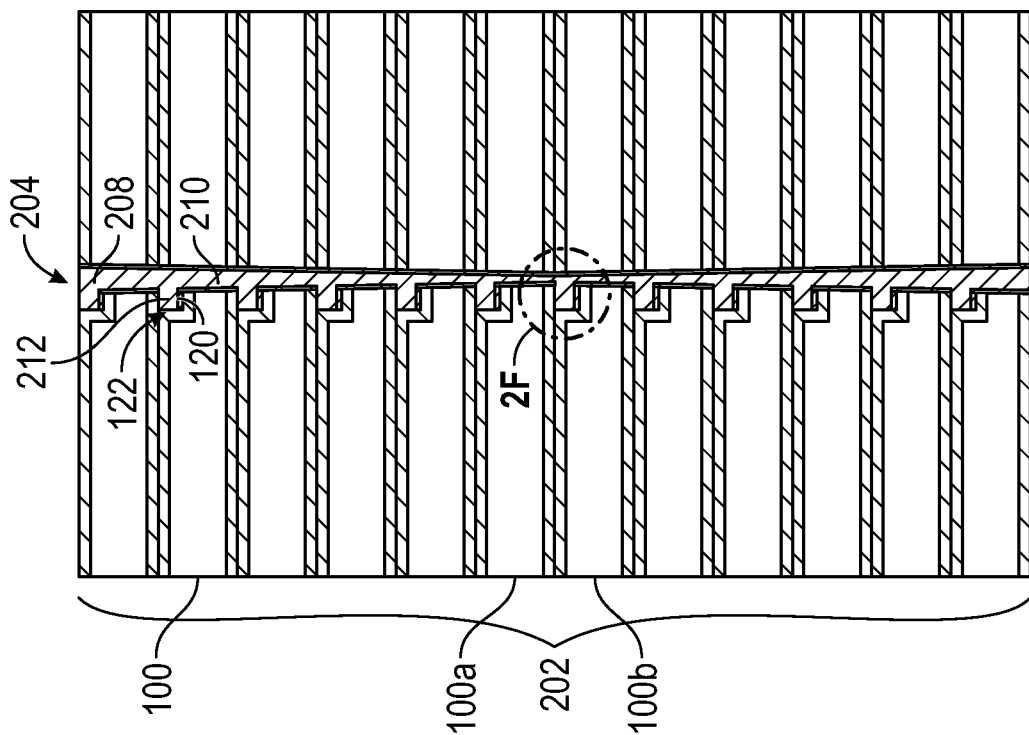
FIG. 2N
FIG. 2M

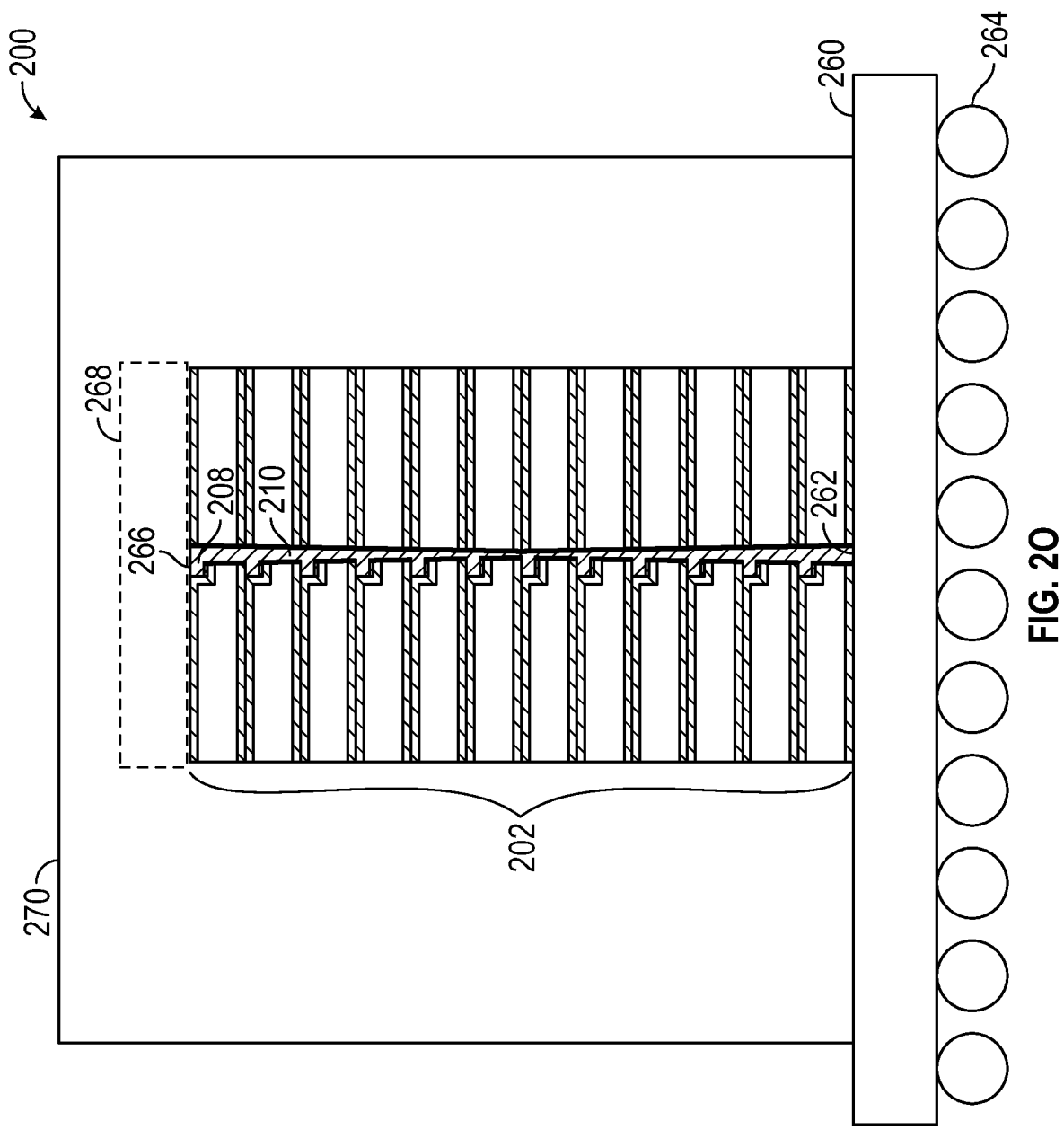

SEMICONDUCTOR DEVICES WITH RECESSED PADS FOR DIE STACK INTERCONNECTIONS

TECHNICAL FIELD

The present technology generally relates to semiconductor devices, and more particularly relates to semiconductor dies with recessed pads for electrical interconnections with other semiconductor dies.

BACKGROUND

Packaged semiconductor dies, including memory chips, microprocessor chips, and imager chips, typically include a semiconductor die mounted on a substrate and encased in a protective covering. The semiconductor die can include functional features, such as memory cells, processor circuits, and imager devices, as well as bond pads electrically connected to the functional features. The bond pads can be electrically connected to terminals outside the protective covering to allow the semiconductor die to be connected to higher level circuitry.

Market pressures continually drive semiconductor manufacturers to reduce the size of die packages to fit within the space constraints of electronic devices, while also driving them to increase the functional capacity of each package to meet operating parameters. One approach for increasing the processing power of a semiconductor package without substantially increasing the surface area covered by the package (the package's "footprint") is to vertically stack multiple semiconductor dies on top of one another in a single package. The dies in such vertically-stacked packages can be electrically coupled to each other and/or to a substrate via wires, interconnects, or other conductive structures. However, conventional solder interconnects for electrically coupling dies in a vertical stack can significantly increase the overall package height. Hybrid bonding techniques can reduce package height, but typically have stringent requirements for alignment, surface cleaning, and planarization that may be difficult and costly to achieve.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

FIG. 2A is a partially schematic side cross-sectional view of a semiconductor assembly during an initial stage of a manufacturing process, in accordance with embodiments of the present technology.

FIG. 2B is a partially schematic side cross-sectional view of the semiconductor assembly of FIG. 2A during another stage of the manufacturing process, in accordance with embodiments of the present technology.

FIGS. 2C-2H illustrate various configurations for a recess and a channel of the semiconductor assembly of FIG. 2B, in accordance with embodiments of the present technology.

FIG. 2I is a partially schematic side cross-sectional view of the semiconductor assembly of FIG. 2A during a further stage of the manufacturing process, in accordance with embodiments of the present technology.

FIGS. 2J-2L are closeup views of a portion of the semiconductor assembly of FIG. 2I, in accordance with embodiments of the present technology.

FIG. 2M is a partially schematic side cross-sectional view of the semiconductor assembly of FIG. 2A during yet another stage of the manufacturing process, in accordance with embodiments of the present technology.

FIG. 2N is a closeup view of a portion of the semiconductor assembly of FIG. 2M, in accordance with embodiments of the present technology.

FIG. 2O is a partially schematic side cross-sectional view of the semiconductor assembly of FIG. 2A during another stage of the manufacturing process, in accordance with embodiments of the present technology.

DETAILED DESCRIPTION

Figure 1:
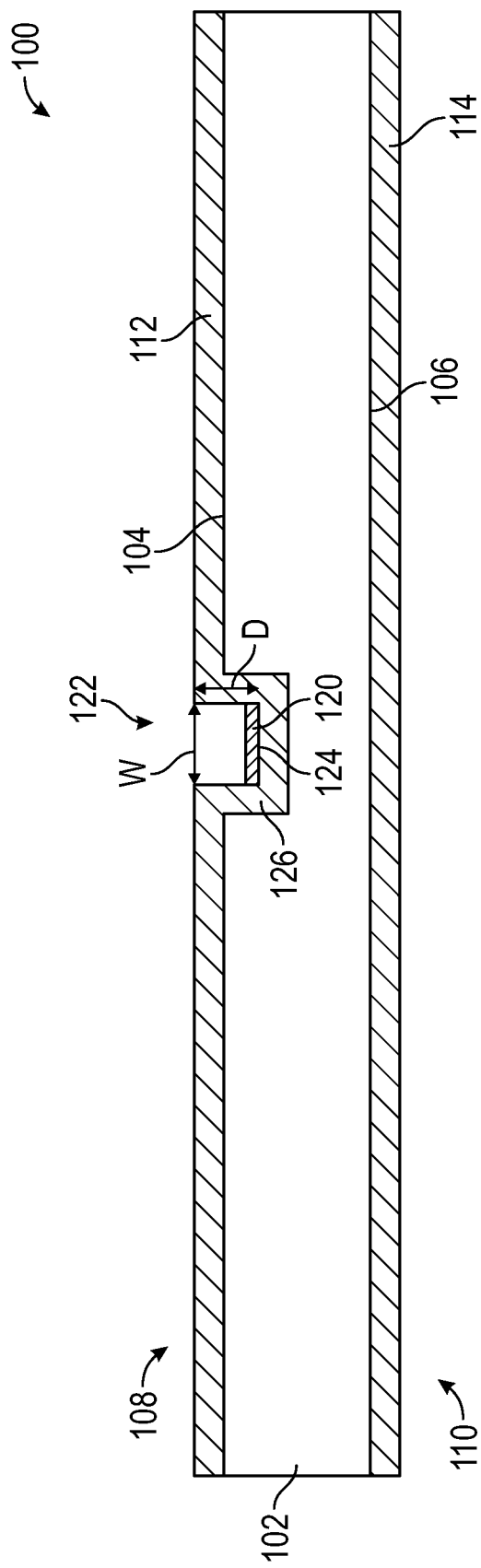
FIG. 1 is a partially schematic side cross-sectional view of a semiconductor die configured in accordance with embodiments of the present technology.

Specific details of several embodiments of semiconductor devices, and associated systems and methods, are described below. In some embodiments, for example, a semiconductor assembly includes a die stack having a plurality of semiconductor dies. Each semiconductor die can include a first (e.g., upper) surface having a first insulating material and a second (e.g., lower) surface having a second insulating material. Additionally, each semiconductor dies can include a recess formed in at least one of the first or second surfaces, and a conductive pad within the recess. The insulating materials on the surfaces of the semiconductor dies can include a dielectric material (e.g., an oxide or nitride material), such that the semiconductor dies can be directly coupled to each other via dielectric bonding. The semiconductor assembly can further include a conductive structure electrically coupled to each of the semiconductor dies. The conductive structure can include a monolithic via extending continuously through each of the semiconductor dies in the die stack, and a plurality of protrusions extending from the via. The protrusions and the via can be made of a continuous, monolithic material. Each protrusion can be positioned within the recess of a respective semiconductor die, and can be electrically coupled to the conductive pad within the recess. The conductive structure can be formed after the semiconductor dies have been assembled into the die stack, e.g., using through an electroless plating or electroplating process.

The present technology can provide several advantages compared to conventional devices and manufacturing processes. For example, because neighboring semiconductor dies can be coupled directly by the insulating materials on the surfaces of the dies, rather than by additional interposing structures such as solder bumps or pillars, the vertical separation between the semiconductor dies can be reduced or minimized, thus allowing for smaller package heights. Additionally, because the conductive structure electrically coupling the semiconductor dies can be formed in situ after die stack formation, the methods described herein can provide reliable die-to-die interconnections while avoiding the stringent alignment, surface cleaning, and planarization requirements associated with hybrid bonding approaches.

A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using semiconductor manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1-4. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1 is a partially schematic side cross-sectional view of a semiconductor die 100 ("die 100") configured in accordance with embodiments of the present technology. The die 100 includes a semiconductor substrate 102 (e.g., a silicon substrate, a gallium arsenide substrate, an organic laminate substrate, etc.) having a first (e.g., upper) side 104 and a second (e.g., lower) side 106. One or both of the first and second sides 104, 106 can be a front and/or active side including various types of semiconductor components, such as memory circuits (e.g., dynamic random-access memory (DRAM), static random-access memory (SRAM), flash memory (e.g., NAND, NOR), or other type of memory circuits), controller circuits (e.g., DRAM controller circuits), logic circuits, processing circuits, circuit elements (e.g., wires, traces, interconnects, transistors, etc.), imaging components, and/or other semiconductor features. Optionally, either the first side 104 or the second side 106 can be a back and/or passive side that does not include any active semiconductor components. The semiconductor substrate 102 can have any suitable thickness, such as a thickness less than or equal to 100 μm, 75 μm, 50 μm, 25 μm, or 10 μm.

In some embodiments, the die 100 has a first (e.g., upper) surface 108 including a first (e.g., upper) insulating material 112, and a second (e.g., lower) surface 110 including a second (e.g., lower) insulating material 114. The first insulating material 112 can partially or fully cover the first side 104 of the semiconductor substrate 102, and the second insulating material 114 can partially or fully cover the second side 106 of the semiconductor substrate 102. The first and second insulating materials 112, 114 can each have any suitable thickness, such as a thickness less than or equal to 5 μm, 2 μm, 1 μm, 500 nm, 200 nm, 150 nm, or 100 nm.

The first and/or second insulating materials 112, 114 can each be or include one or more layers of a dielectric material, such as a passivation material, a polyimide material, and/or other suitable material used to cover a surface of a semiconductor device. In some embodiments, the first and/or second insulating materials 112, 114 each include a dielectric material (e.g., an oxide material, a nitride material, etc.) suitable for direct dielectric bonding (e.g., an oxide-oxide bond, a nitride-nitride bond, etc.). For example, the first and/or second insulating materials 112, 114 can include silicon oxide, silicon nitride, silicon oxynitride, silicon carbon nitride, poly-silicon nitride, poly-silicon oxide, tetraethyl orthosilicate (TEOS), and the like. In some embodiments, the first and/or second insulating materials 112, 114 can include a dielectric material with a small dielectric constant relative to silicon oxide (a "low-κ dielectric material"). Such low-κ dielectric materials can include fluorine-doped silicon dioxide, carbon-doped silicon dioxide, porous silicon dioxide, organic polymeric dielectrics, silicon based polymeric dielectrics, etc.

The die 100 also includes components for communicating with other devices (e.g., another semiconductor die), such as at least one conductive pad 120. The conductive pad 120 can be an electrically conductive component (e.g., a bond pad, contact, trace, metal layer) suitable for forming an electrical interconnection to another device. In the illustrated embodiment, the conductive pad 120 is located on the first surface 108 of the die 100, and can be electrically coupled to the semiconductor components in the first side 104 of the semiconductor substrate 102 by signal routing components extending through the first insulating material 112 (e.g., routing layers, vias, traces, etc.—omitted for purposes of simplicity). In other embodiments, however, the conductive pad 120 can be located on the second surface 108 of the die 100, and can be electrically coupled to the semiconductor components in the second side 106 of the semiconductor substrate 102.

The conductive pad 120 can be positioned within a recess 122 in the die 100. For example, in FIG. 1, the recess 122 is located in the first surface 108 of the die 100. In other embodiments, however, the recess 122 can be located in the second surface 110 of the die 100. The conductive pad 120 can be positioned at a bottom surface 124 of the recess 122 and can partially or fully cover the bottom surface 124. In some embodiments, the recess 122 extends partially into the semiconductor substrate 102 so that the bottom surface 124 of the recess 122 is vertically offset from (e.g., below) the first side 104 of the semiconductor substrate 102. Alternatively, the recess 122 can be located entirely in the first insulating material 112, such that the bottom surface 124 of the recess 122 is aligned with or above the first side 104 of the semiconductor substrate 102. Optionally, the first insulating material 112 can also include a recessed region 126 partially or fully surrounding the recess 122. The recessed region 126 can extend into the semiconductor substrate 102 and can separate the conductive pad 120 from the semiconductor substrate 102.

The geometry (e.g., size, shape) of the recess 122 can be varied as desired. For example, the recess 122 can have a depth D within a range from 1 μm to 10 μm, or a range from 1 μm to 5 μm. In some embodiments, the depth D is no more than 10 μm, 5 μm, 4 μm, 3 μm, 2 μm, or 1 μm. The recess 122 can have a width W within a range from 5 μm to 50 μm, or within a range from 10 μm to 20 μm. In some embodiments, the width W is greater than or equal to 5 μm, 10 μm, 15 µm, or 20 µm. Optionally, the ratio between the width W and the depth D can be at least 1.5:1, 2:1, 2.5:1, or 5:1. Additionally, although the recess 122 is depicted in FIG. 1 as having a rectangular vertical cross-sectional shape, in other embodiments, the recess 122 can have a different vertical cross-sectional shape (e.g., square, trapezoidal, triangular, U-shaped, etc.). Similarly, the horizontal cross-sectional shape of the recess 122 (e.g., the shape of the recess 122 when viewed from directly above) can be rectangular, square, circular, oval, or any other suitable shape. In some embodiments, the geometry and location of the recess 122 is configured to provide a "shadow" effect to protect the conductive pad 120 during a material deposition process, as described further below.

Although FIG. 1 shows a single conductive pad 120 and recess 122, in other embodiments, the die 100 can include multiple conductive pads 120 and recesses 122. For example, the die 100 can include at least two, three, four five, ten, fifteen, twenty, 50, 100, hundreds, thousands, or more conductive pads 120 and/or recesses 122. The conductive pads 120 and recesses 122 can be located in the upper surface 108 of the die 100, the lower surface 110 of the die 100, or suitable combinations thereof. In embodiments where the die 100 includes multiple conductive pads 120 and recesses 122, the recesses 122 can be spaced apart from each other and distributed along the upper and/or lower surfaces 108, 110 of the die 100, and each conductive pad 120 can be located within a respective recess 122.

FIGS. 2A-2O illustrate a semiconductor assembly 200 ("assembly 200") during various stages of a manufacturing process, in accordance with embodiments of the present technology. Referring first to FIG. 2A, the assembly 200 includes a die stack 202 having a plurality of dies 100 (reference numbers are shown only for a subset of the dies 100 for purposes of clarity). Each of the dies 100 can include any of the features described above with reference to FIG. 1, such that like numbers (e.g., insulating material 114 versus insulating material 114a) are used to identify identical or similar components across FIGS. 1-20. Although FIG. 2A depicts the die stack 202 as including twelve dies 100, in other embodiments, the die stack 202 can include a different number of dies 100, such as two, three, four, five, six, seven, eight, nine, or ten dies 100.

In an initial stage of the manufacturing process, the dies 100 are assembled to form the die stack 202. Each die 100 can be directly coupled to at least one neighboring die, such that there are no additional components or structures (e.g., conductive bumps or pillars) interposed between the surfaces of neighboring dies. In the illustrated embodiment, for example, an upper die 100a is coupled to a lower die 100b via direct bonding between a lower surface 110a of the upper die 100a and an upper surface 108b of the lower die 100b. As previously described, the lower surface 110a and the upper surface 108b can each include a respective insulating material 114a, 112b, which can be or include a dielectric material (e.g., an oxide or nitride material). Accordingly, the upper and lower dies 100a-b can be coupled to each other by direct dielectric bonding (e.g., oxide-oxide bonding or nitride-nitride bonding) between the insulating materials 114a, 112b, in accordance with techniques known to those of skill in the art. In some embodiments, all of the dies 100 are assembled into a vertical stack and then bonded to each other in a single process step. In other embodiments, the dies 100 can be sequentially stacked and bonded to each other in multiple process steps.

In the illustrated embodiment, the upper surface 108 of each die 100 includes a recess 122 having a conductive pad 120, as previously described in FIG. 1. When the dies 100 are assembled into the die stack 202, the recesses 122 and conductive pads 120 of each of the dies 100 can be vertically aligned with each other. For example, as shown in FIG. 2A, each recess 122 and conductive pad 120 can be located along and/or intersect a vertical axis A of the die stack 202. In other embodiments, however, the recesses 122 and conductive pads 120 can be arranged differently. For example, some or all of the recesses 122 and conductive pads 120 can be located on the lower surface 110 of the corresponding die 100, rather than on the upper surface 108. As another example, some of the recesses 122 and conductive pads 120 may not be vertically aligned with each other and/or can be located along different vertical axes. Additionally, although the vertical axis A is depicted as being the central vertical axis of the die stack 202, in other embodiments, the vertical axis A can be laterally offset from the central vertical axis of the die stack 202. Optionally, some of the dies 100 may not include any recesses 122 and/or conductive pads 120.

Referring next to FIG. 2B, the manufacturing process can include forming a channel 204 in the die stack 202. In the illustrated embodiment, the channel 204 extends through the entire height of the die stack 202 and through each of the dies 100, e.g., from an upper surface 108 of an uppermost die 100c to a lower surface 110d of a lowermost die 100d. In other embodiments, the channel 204 can extend only partially through the die stack 202 and through only a subset of the dies 100. The channel 204 can be connected to some or all of the recesses 122 of the dies 100 so as to form a continuous open space or region within the die stack 202. For example, the channel 204 can be aligned with and/or at least partially overlap the vertical axis A so that the channel 204 intersects at least a portion of each recess 122.

Figure 2C:
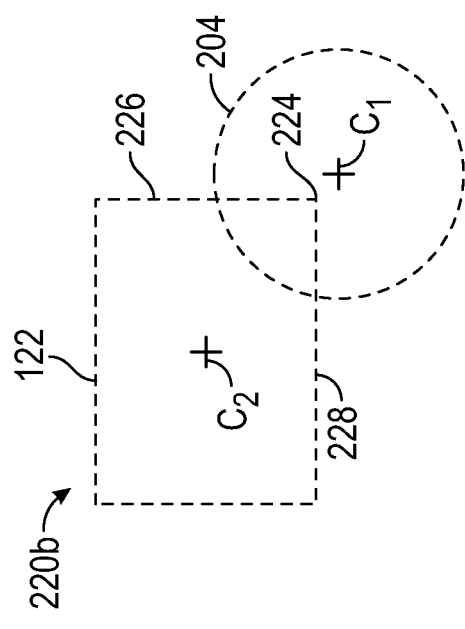

FIGS. 2C-2H illustrate various examples of configurations 220a-f for the recesses 122 and the channel 204 of the assembly 200 of FIG. 2B, in accordance with embodiments of the present technology. Specifically, FIGS. 2C-2H are top views of the boundaries (shown in broken lines) of an individual recess 122 and the channel 204; the other components of the assembly 200 are omitted for purposes of clarity.

Referring first to FIG. 2C, in configuration 220a, the channel 204 is laterally offset from the recess 122, such that the center $C_1$ of the channel 204 is spaced apart from the center $C_2$ of the recess 122. In the illustrated embodiment, the channel 204 intersects and overlaps a single side 222 of the recess 122. In other embodiments, however, the channel 204 can intersect and/or overlap two, three, or all four sides of the recess 122.

Figure 2D:
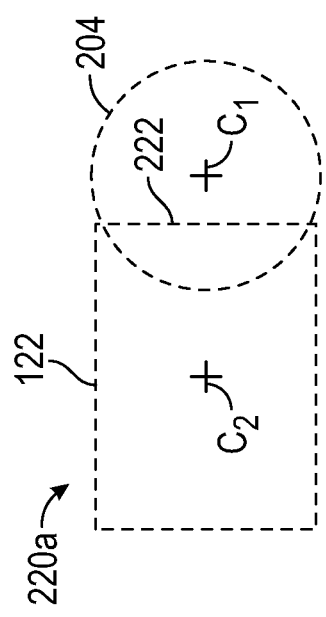

Referring next to FIG. 2D, the configuration 220b is generally similar to the configuration 220a, except that the channel 204 overlaps a single corner 224 of the recess 122. The channel 204 also intersects and overlaps the two sides 226, 228 of the recess 122 connected to the corner 224. Alternatively, the channel 204 can overlap two or three corners of the recess 122.

Figure 2E:
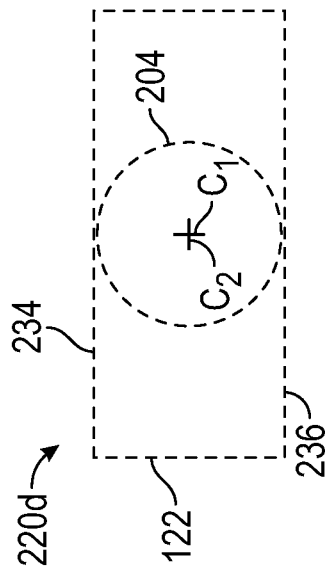

Referring next to FIG. 2E, in configuration 220c, the channel 204 is centered with the recess 122, such that the center $C_1$ of the channel 204 is aligned with and overlaps the center $C_2$ of the recess 122. In the embodiment of FIG. 2E, the channel 204 intersects and overlaps two opposite sides 230, 232 of the recess 122. Alternatively, the channel 204 can intersect and overlap a different number of sides of the recess 122 (e.g., a single side, three sides, all four sides). Additionally, in other embodiments, the channel 204 can be offset from the recess 122 such that the center $C_1$ of the channel 204 can be offset and spaced apart from the center $C_2$ of the recess 122 (e.g., as previously depicted in FIGS. 2C and 2D).

Figure 2F:
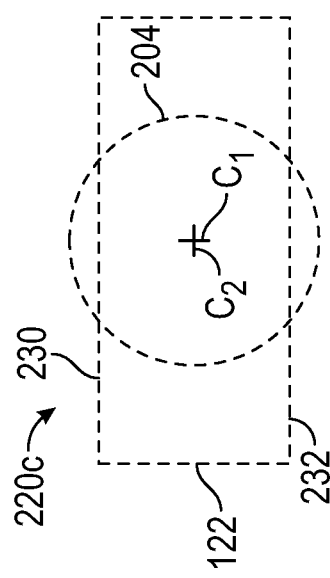

Referring next to FIG. 2F, the configuration 220d can be generally similar to the configuration 220c, except that the channel 204 is contained entirely within the boundaries of the recess 122 and is tangential to the two opposite sides 234, 236 of the recess 122. In other embodiments, however, the channel 204 can be tangential to a different number of sides of the recess 122 (e.g., a single side, three sides, all four sides) while remaining contained within the recess 122. Optionally, the channel 204 can be tangential to some of the sides of the recess 122, while intersecting and overlapping other sides of the recess 122, such that the channel 204 is only partially within the recess 122.

Referring next to FIG. 2G, in configuration 220e, the channel 204 is contained entirely within the recess 122, and is tangential to a single side 238 of the recess 122 without contacting the other three sides 240-244 of the recess 122. In other embodiments, the channel 204 can be tangential to two, three, or all four sides of the recess 122 while remaining contained within the recess 122. Additionally, although FIG. 2G depicts the center $C_1$ of the channel 204 as being offset from the center $C_2$ of the recess 122, in other embodiments the center $C_1$ of the channel 204 can be aligned with and overlap the center $C_2$ of the recess 122.

Referring next to FIG. 2H, the configuration 220f can be generally similar the configuration 220e, except that the channel 204 does not contact any of the sides 246-252 of the recess 122. Although FIG. 2H shows the channel 204 as being centered within the recess 122, in other embodiments, the center $C_1$ of the channel 204 can be offset from the center $C_2$ of the recess 122.

Any of the features of the configurations 220a-f of FIGS. 2C-2H can be combined with each other and/or incorporated into the assembly 200 of FIG. 2B. Additionally, the configurations 220a-f of FIGS. 2C-2H can be varied in many different ways. For example, although the recess 122 is depicted as being square or rectangular, and the channel 204 is depicted as being circular, in other embodiments, the recess 122 and/or channel 204 can each have a different shape (e.g., oval, triangular, trapezoidal, etc.). Additionally, the relative sizes of the recess 122 and channel 204 can be varied as desired, e.g., the recess 122 can have a larger surface area than the channel 204, the recess 122 can have a smaller surface area than the channel 204, or the recess 122 can have the same surface area as the channel 204. The amount of overlap between the recess 122 and channel 204 can also be modified. In some embodiments, for example, the channel 204 overlaps no more than 90%, 80%, 70%, 60%, 50%, 40%, 30%, 20%, or 10% of the horizontal surface area of the recess 122.

Referring again to FIG. 2B, the geometry (e.g., size, shape) of the channel 204 can be varied as desired. For example, the channel 204 can have any suitable length, such as a length of at least 50 µm, 100 µm, 150 µm, 200 µm, 250 µm, 100 µm, 150 µm, 400 µm, 450 µm, or 500 µm. The width of the channel 204 (e.g., the maximum, minimum, or average width) can be no more than 20 µm, 15 µm, 10 µm, 5 µm, 4 µm, 1 µm, 2 µm, or 1 µm. The ratio of the channel length to the channel width (e.g., the maximum, minimum, or average width) can be at least 20:1, 10:1, 40:1, 50:1, 60:1, 70:1, 80:1, 90:1, or 100:1. Although the illustrated embodiment depicts the channel 204 as having a variable width (e.g., wider near the upper and lower ends of the die stack 202, narrower near the center of the die stack 202), in other embodiments, the channel 204 can have a uniform or a substantially uniform width. The horizontal cross-sectional shape of the channel 204 (e.g., the shape of the channel 204 when viewed from directly above) can be circular, oval, square, rectangular, or any other suitable shape.

The channel 204 can be formed using any suitable material removal process, such an etching process (e.g., a Bosch process or other process for forming through-silicon vias (TSVs)), a drilling process, or a combination thereof. For example, etching can be performed starting from the uppermost die 100c and proceeding downward into the die stack 202, starting from the lowermost die 100d and proceeding upward into the die stack 202, or in both directions simultaneously or sequentially. In some embodiments, for example, the channel 204 can include two segments: an upper segment formed by etching from the uppermost die 100c downwards, and a lower segment formed by etching from the lowermost die 100d upwards. In other embodiments, the channel 204 can include a single segment formed by etching from a single direction (e.g., upwards only or downwards only).

Referring next to FIGS. 2I and 2J together (FIG. 2J is a closeup view of a portion of FIG. 2I), at least one material layer 206 is deposited within the channel 204. The material layer(s) 206 can coat at least a portion of the channel 204, while leaving the conductive pads 120 of the dies 100 at least partially or fully exposed. For example, as best seen in FIG. 2J, the material layer(s) 206 covers the sidewall surfaces of the semiconductor substrates 102a-b of the upper and lower dies 100a-b along the channel 204. The material layer(s) 206 can also cover the sidewall surfaces of the insulating materials 114a, 112b along the channel 204. In the illustrated embodiment, the material layer(s) 206 do not extend into the recess 122b and/or is sufficiently spaced apart from at least a portion of the conductive pad 120b so that the conductive pad 120b is partially or entirely uncovered by the material layer(s) 206.

In other embodiments, however, the material layer(s) 206 can extend partially into the recess 122b and/or onto the conductive pad 120b. In FIG. 2K, for example, the material layer(s) 206 include a region 207a that covers a portion of the conductive pad 120b (e.g., the portion closest to the channel 204), while leaving the remaining portion of the conductive pad 120b exposed (e.g., the portion away from the channel 204 and/or farthest within the recess 122b). For example, the region 207a can cover no more than 90%, 80%, 70%, 60%, 50%, 40%, 30%, 20%, 10%, or 5% of the surface area of the conductive pad 120b. As another example, in FIG. 2L, the material layer(s) 206 include a region 207b that covers a portion of the upper surface of the recess 122b away from the conductive pad 120b, such that the surface of the conductive pad 120b remains entirely exposed. Optionally, the material layer(s) 206 can extend both over a portion of the conductive pad 120b (e.g., as shown in FIG. 2K) and over a portion of the recess 122b away from the conductive pad 120b (e.g., as shown in FIG. 2L).

The composition of the material layer(s) 206 can be varied as desired. In some embodiments, for example, the material layer(s) 206 include at least one layer of an insulating material, such as a dielectric and/or passivation material (e.g., an oxide or nitride material such as silicon oxide, silicon nitride, etc.). The insulating material can electrically isolate the semiconductor substrates 102 of the dies 100 from a conductive material (e.g., copper) to be deposited within the channel 204, as described below with reference to FIGS. 2M and 2N. Alternatively or in combination, the material layer(s) 206 can include at least one barrier material configured to reduce or prevent diffusion and/or electromigration of the conductive material. For example, the barrier material can be or include a material that reduces or prevents copper diffusion, such as tantalum, tantalum nitride, titanium, titanium nitride, tungsten, nickel, etc. The barrier material can also promote adhesion of the conductive material (e.g., to the insulating material and/or to the semiconductor substrates 102 of the dies 100).

Although FIGS. 2I-2L illustrate a single material layer 206 within the channel 204, in other embodiments, the assembly 200 can include a plurality of discrete material layers 206 within the channel 204, such as two, three, four, five, or more material layers 206. In some embodiments, for example, the assembly 200 includes a first material layer (e.g., a layer of an insulating material) and a second material layer (e.g., a layer of a barrier material). The first material layer can be deposited before the second material layer, such that the first material layer is interposed between the second material layer and the dies 100. Each material layer 206 can independently have any suitable thickness, such as a thickness less than or equal to 5 μm, 2 μm, 1 μm, 500 nm, 200 nm, 150 nm, or 100 nm.

The material layer(s) 206 can be deposited using any suitable material deposition process known to those of skill in the art, such as chemical vapor deposition (CVD), physical vapor deposition (PVD), or atomic layer deposition (ALD). In some embodiments, the material layer(s) 206 are created using a deposition process in which the directionality of the reactant source (e.g., reactant gas flow) relative to the assembly 200 affects where the material is formed (also referred to herein as a "directional deposition process"), such as CVD or PVD. When a directional deposition process is used, the recesses 122 can provide a shadow effect that reduces the amount of reactant that reaches the surfaces of the conductive pads 120, or prevents the reactant from reaching the surfaces of the conductive pads 120 altogether. For example, in the embodiment of FIG. 2I, if the reactant gas is introduced into the channel 204 from the top of the die stack 202, some material may be deposited onto the conductive pads 120 (e.g., as shown in FIG. 2K), but the overhang provided by the recesses 122 can prevent the conductive pads 120 from being completely covered by the deposited material. Conversely, if the reactant gas is introduced into the channel 204 from the bottom of the die stack 202, the material can be primarily deposited onto the upper surfaces of the recesses 122 (e.g., as shown in FIG. 2L) and/or away from the conductive pads 120. Accordingly, the conductive pads 120 can remain partially or entirely uncovered by the material layer(s) 206 during the deposition process.

Referring next to FIGS. 2M and 2N together (FIG. 2N is a closeup view of a portion of FIG. 2M), the manufacturing process includes depositing a conductive material into the channel 204 to form a conductive structure 208. The conductive structure 208 can electrically interconnect the dies 100 so the dies 100 can communicate with each other and/or with an external component (e.g., another semiconductor die, a package substrate, an external device, etc.). In the illustrated embodiment, the conductive structure 208 is a continuous volume of conductive material including an elongate, monolithic via 210, and a plurality of protrusions 212 that are monolithic with the via 210. The via 210 can extend partially or entirely through the die stack 202 and can be positioned adjacent to each of the recesses 122 of the dies 100. The protrusions 212 can extend laterally from the via 210 and into the recesses 122. As best seen in FIG. 2M, each protrusion 212 can partially or completely fill the corresponding recess 122b, and can be electrically coupled to the conductive pad 120b within the recess 122b. Accordingly, signals can be transmitted to and/or from the corresponding die 100b by the conductive pad 120b, protrusion 212, and via 210.

The conductive structure 208 can be made of any suitable electrically conductive material, such as copper, tungsten, nickel, gold, or combinations thereof. The conductive material can be deposited using any suitable technique known to those of skill in the art. In some embodiments, for example, the conductive structure 208 is deposited using a plating process, such as an electroless plating process or an electroplating process. In such embodiments, the plating process can include an initial step of applying a seed layer of material onto the surfaces of the channel 204 (e.g., onto the material layer(s) 206 within the channel 204) and/or onto the conductive pads 120 of the dies 100. The seed layer can include any suitable conductive material (e.g., titanium, copper) and can be applied using sputtering, CVD, PVD, ALD, or other techniques known to those of skill in the art. Optionally, the dies 100 can already include a seed layer on the conductive pads 120 before being assembled into the die stack 202, or the conductive pads 120 themselves can serve as the seed layer.

Subsequently, the plating process can be performed to form the conductive structure 208 from the seed layer. The conductive structure 208 can partially or completely fill the channel 204 and recesses 122 so the geometry (e.g., size, shape) of the conductive structure 208 is identical or generally similar to the geometry of the channel 204 and recesses 122. In some embodiments, because the conductive structure 208 is made of a continuous, monolithic material and is formed in situ after the die stack 202 is assembled, the approaches described herein can avoid issues with alignment, surface cleaning, planarization, and/or other low tolerance process parameters involved when performing direct metal-to-metal bonding between discrete vias in separate dies.

Referring next to FIG. 2O, the die stack 202 can be incorporated into a larger semiconductor device or package including components known to those of skill in the art. For example, the die stack 200 can be mounted onto a substrate 260, which can be or include a package substrate, an interposer, a printed circuit board, a built-up redistribution layer (RDL), a dielectric spacer, or another semiconductor die (e.g., a logic die). In such embodiments, the bottom surface 262 of the via 210 of the conductive structure 208 can be electrically coupled to a contact (e.g., a bond pad, via, etc.) exposed on the substrate 260, thus allowing the die stack 202 to communicate with the substrate 260. Although FIG. 2O illustrates the via 210 as being directly coupled to the substrate 260, in other embodiments, the assembly 200 can include an electrical interconnect (e.g., a conductive bump or pillar) interposed between and coupled to the via 210 and the substrate 260. The substrate 260 itself can be coupled to conductive elements 264 (e.g., solder balls, conductive bumps, conductive pillars, conductive epoxies, and/or other suitable electrically conductive elements) for connecting to an external device.

In some embodiments, the upper surface 266 of the via 210 of the conductive structure 208 is electrically coupled to another semiconductor die 268 (shown in broken lines). The via 210 can be connected directly to a contact (e.g., bond pad, exposed via, etc.) on the semiconductor die 268, or can be connected indirectly via an electrical interconnect (e.g., a conductive bump or pillar—not shown) interposed between the via 210 and the semiconductor die 268. In other embodiments, however, the semiconductor die 268 is optional and can be omitted.

The die stack 202 can be encapsulated in a mold material 270, such as a resin, epoxy resin, silicone-based material, polyimide, or any other material suitable for protecting the various components of the die stack 202 from contaminants and/or physical damage. The mold material 270 can cover the upper and/or lateral surfaces of the die stack 202, and at least a portion of the substrate 260. In embodiments where the semiconductor die 268 is omitted, the mold material 270 can cover the exposed upper surface 266 of the via 210. The assembly 200 can also include other package components such as external heatsinks, a casing (e.g., thermally conductive casing), electromagnetic interference (EMI) shielding components, etc.

Although the assembly 200 is depicted as including a single conductive structure 208, the process described with reference to FIGS. 2A-2O can be modified to produce a semiconductor assembly with multiple conductive structures 208 (e.g., two, three, four, five, six, seven, eight, nine, ten, twenty, 50, 100, hundreds, thousands, or more conductive structures 208). In such embodiments, some or all of the dies 100 of the die stack 202 can include multiple recesses 122 and conductive pads 120 that are aligned along multiple vertical axes. For example, a first set of recesses 122 and pads 120 can be located along a first vertical axis, a second set of recesses 122 and pads 120 can be located along a second vertical axis, and so on. Subsequently, a plurality of channels 204 can be formed in the die stack 202, with each channel 204 being connected to a respective set of recesses 122 (e.g., as previously described with reference to FIGS. 2B-2H). One or more material layer(s) 206 can then be deposited into some or all of the channels 204 (e.g., described above with reference to FIGS. 2I-2L). Each channel 204 can then be partially or entirely filled with a conductive material to form a plurality of conductive structures 208 (e.g., as previously described with reference to FIGS. 2M and 2N). Each conductive structure 208 can be a continuous, monolithic structure that is electrically coupled to a respective set of conductive pads 120 and interconnects the corresponding dies 100.

Figure 3:
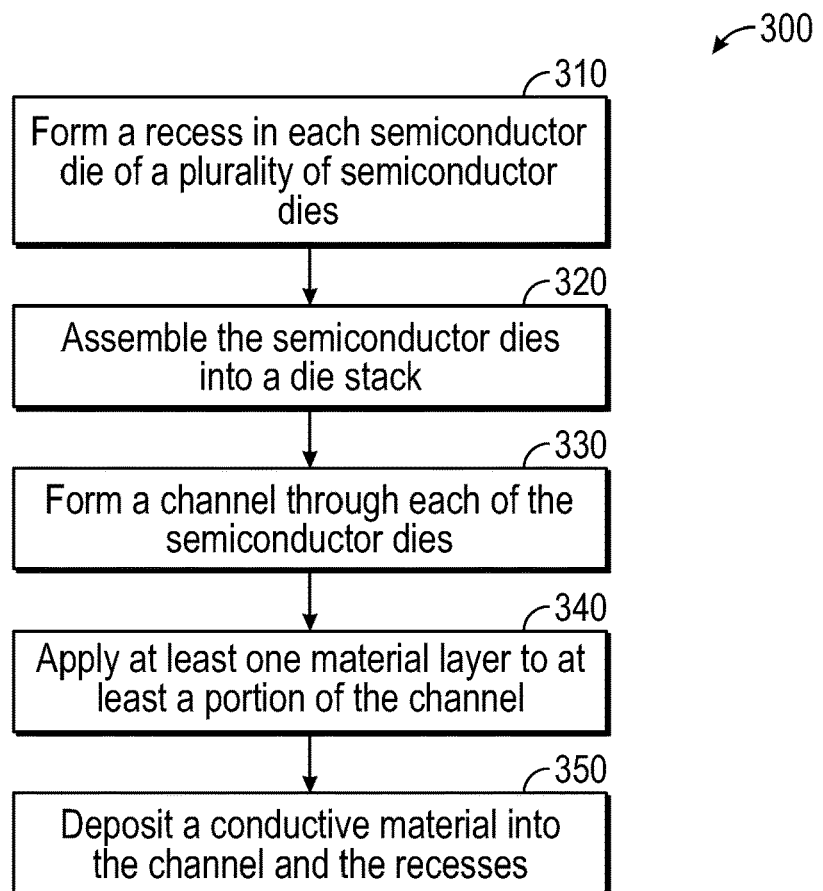
FIG. 3 is a flow diagram illustrating a method for manufacturing a semiconductor assembly in accordance with embodiments of the present technology.

FIG. 3 is a flow diagram illustrating a method 300 for manufacturing a semiconductor assembly in accordance with embodiments of the present technology. The method 300 can be used to fabricate any of the devices and packages described herein, such as the semiconductor die 100 of FIG. 1 and/or the semiconductor assembly 200 of FIGS. 2A-2O.

The method 300 begins at step 310 with forming at least one recess (e.g., recess 122 of FIG. 1) in each semiconductor die of a plurality of semiconductor dies. The recess can be formed using semiconductor manufacturing techniques known to those of skill in the art (e.g., selectively removing portions of a semiconductor substrate and/or insulating material by etching and/or other suitable processes). Step 310 can further include forming a conductive pad (e.g., conductive pad 120 of FIG. 1) in each recess, e.g., by selectively depositing a conductive material into each recess.

At step 320, the method 300 continues with assembling the semiconductor dies into a die stack. Step 320 can include any of the processes previously discussed with reference to FIG. 2A. For example, step 320 can include arranging the semiconductor dies in a vertical stack so that the surfaces of adjacent semiconductor dies directly contact each other, and then connecting the adjacent semiconductor dies to each other via direct dielectric bonding between the insulating materials on the surfaces of the dies.

At step 330, the method 300 includes forming a channel through each of the semiconductor dies, after the semiconductor dies have been assembled into the die stack. Step 330 can include any of the processes previously described with reference to FIGS. 2B-2H. For example, step 330 can include removing material from the die stack using etching, drilling, etc., to create the channel. The channel can be connected to some or all of the recesses so as to form a continuous space within the die stack.

At step 340, the method 300 optionally includes applying at least one material layer to at least a portion of the channel. Step 340 can include any of the processes discussed above with reference to FIGS. 2I-2L. For example, step 340 can include applying a first material layer (e.g., a layer of insulating material) to the walls of the channel, then applying a second material layer (e.g., a layer of a diffusion barrier material) onto the first material layer. As described above, the material layer(s) can be applied using a directional deposition process (e.g., CVD, PVD), and the recesses can protect the conductive pads from being covered with the material layer(s) during the directional deposition process so the conductive pads remain at least partially exposed.

At step 350, the method 300 continues with depositing a conductive material into the channel and the recesses. Step 350 can include any of the processes discussed above with reference to FIGS. 2M and 2N. For example, step 350 can include applying a seed layer to at least a portion of the channel (e.g., onto the material layer(s) applied in step 340) and/or to the conductive pads of the semiconductor dies, and then forming the conductive material on the seed layer using plating (e.g., electroless plating or electroplating) or other suitable material deposition process. The deposition of the conductive material can create a continuous conductive structure within the channel and the recesses. The conductive structure can be electrically coupled to each of the exposed conductive pads to electrically interconnect the semiconductor dies of the die stack.

In some embodiments, the deposition process of step 350 can use "bottom-up filling" or "super-filling" techniques to reduce or prevent voiding at the middle portions of the channel within the interior of the die stack. In such embodiments, step 350 can include introducing at least one additive to the channel and/or recesses to cause the conductive material to preferentially deposit onto selected regions of the channel and/or recesses, in accordance with techniques known to those of skill in the art. For example, step 350 can include introducing at least one accelerator additive (e.g., bis-(3-sulfopropyl disulfide)) configured to increase the rate of deposition onto the middle portion of the channel and/or onto the recesses. Alternatively or in combination, step 350 can include introducing at least one suppressor additive (e.g., polyethylene glycol) configured to reduce the rate of deposition onto the outer portions of the channel and/or away from the recesses. Accordingly, the conductive material can first fill the middle portion of the channel and/or the recesses, before filling the outer portions of the channel, thus forming a continuous, monolithic via with little or no voiding, seams, gaps, etc.

In some embodiments, some or all of the steps of the method 300 can be repeated to form a die stack with multiple discrete conductive structures interconnecting the semiconductor dies. For example, some or all of steps 330, 340, and/or 350 can be performed multiple times, such as two, three, four, five, ten, twenty, or more times. Optionally, after step 350, the method 300 can further include incorporating the semiconductor assembly into a semiconductor package, as previously described with reference to FIG. 2O. In such embodiments, the method 300 can include mounting the die stack onto a substrate and electrically coupling the conductive structure to the substrate (e.g., directly or via an intervening solder bump, pillar, etc.). The method 300 can then include encapsulating at least a portion of the die stack and/or substrate with a mold material.

Figure 4:
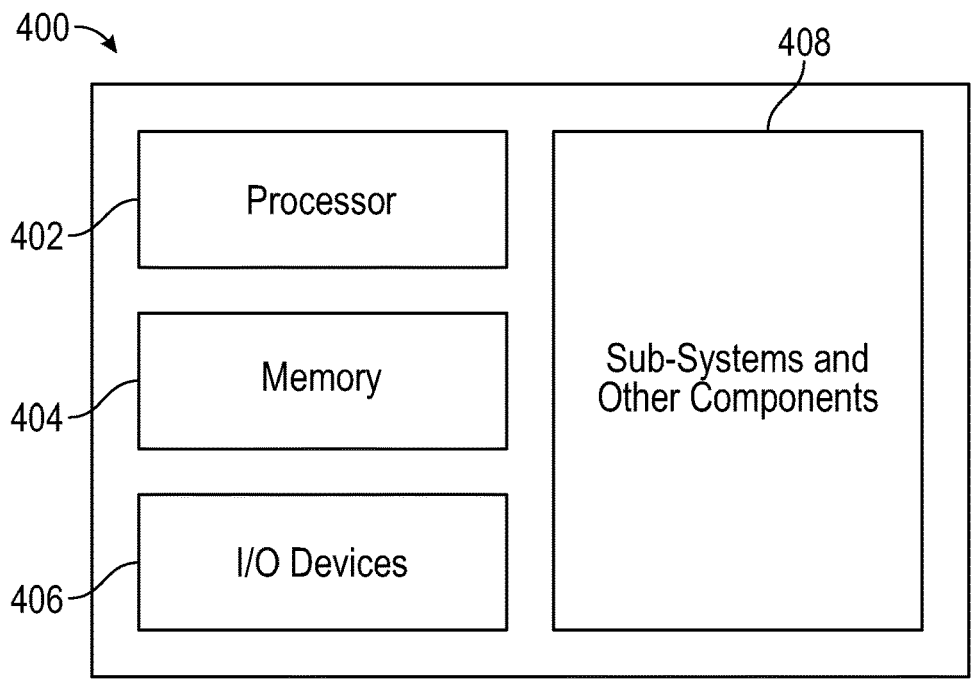
FIG. 4 is a schematic view of a system that includes a semiconductor device or package configured in accordance with embodiments of the present technology.

Any one of the semiconductor devices and/or packages having the features described above with reference to FIGS. 1-3 can be incorporated into any of a myriad of larger and/or more complex systems, a representative example of which is system 400 shown schematically in FIG. 4. The system 400 can include a processor 402, a memory 404 (e.g., SRAM, DRAM, flash, and/or other memory devices), input/output devices 406, and/or other subsystems or components 408. The semiconductor dies and/or assemblies described above with reference to FIG. 1-3 can be included in any of the elements shown in FIG. 4. The resulting system 400 can be configured to perform any of a wide variety of suitable computing, processing, storage, sensing, imaging, and/or other functions. Accordingly, representative examples of the system 400 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 400 include lights, cameras, vehicles, etc. With regard to these and other example, the system 400 can be housed in a single unit or distributed over multiple interconnected units, e.g., through a communication network. The components of the system 400 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor assembly, comprising:
a die stack including a plurality of semiconductor dies, wherein each semiconductor die includes:
a first surface including a first insulating material,
a second surface opposite the first surface, the second surface including a second insulating material,
a recess in the first surface, and
a conductive pad within the recess,
wherein neighboring semiconductor dies in the die stack are directly coupled to each other via the respective first and second insulating materials of the neighboring semiconductor dies; and
a conductive structure electrically coupled to each of the semiconductor dies, wherein the conductive structure includes:
a monolithic via extending through each of the semiconductor dies in the die stack, and
a plurality of protrusions extending laterally from the monolithic via, wherein the plurality of protrusions and the monolithic via are made of a continuous material, and wherein each protrusion is positioned within the recess of a respective one of the semiconductor dies and is electrically coupled to the conductive pad within the recess.

2. The semiconductor assembly of claim 1, further comprising at least one material layer between the monolithic via and at least one sidewall surface of each semiconductor die.

3. The semiconductor assembly of claim 2 wherein the at least one material layer includes an insulating layer.

4. The semiconductor assembly of claim 2 wherein the at least one material layer includes a diffusion barrier layer.

5. The semiconductor assembly of claim 2 wherein the at least one material layer covers no more than a portion of the conductive pads within the recesses.

6. The semiconductor assembly of claim 1 wherein the first and second insulating materials each include a nitride or oxide material.

7. The semiconductor assembly of claim 1 wherein each semiconductor die includes a semiconductor substrate, and the recess extends through the semiconductor substrate.

8. The semiconductor assembly of claim 1 wherein the recess has a width within a range from 5 μm to 50 μm, and a depth within a range from 1 μm to 10 μm.

9. A semiconductor assembly, comprising:
a die stack including a plurality of semiconductor dies, wherein each semiconductor die includes:
an upper surface including an upper dielectric layer,
a lower surface including a lower dielectric layer,
a recess in the upper surface or the lower surface, and
a conductive pad within the recess,
wherein neighboring semiconductor dies in the die stack are coupled to each other via direct bonding between the respective upper and lower dielectric layers of the neighboring semiconductor dies;
a conductive structure electrically coupled to each of the semiconductor dies, wherein the conductive structure includes:
a monolithic via extending continuously through each of the semiconductor dies in the die stack and positioned adjacent to the recesses, and
a plurality of protrusions extending laterally from the monolithic via, wherein the plurality of protrusions and the monolithic via are made of a continuous material, and wherein each protrusion is positioned within the recess of a respective one of the semiconductor dies and is electrically coupled to the conductive pad within the recess; and
an insulating material between the monolithic via and at least a portion of each semiconductor die away from the conductive pad.

10. The semiconductor assembly of claim 9 wherein the monolithic via extends continuously from the upper surface of an uppermost semiconductor die in the die stack to the lower surface of a lowermost semiconductor die in the die stack.

11. The semiconductor assembly of claim 9 wherein the recesses of the semiconductor dies are vertically aligned.

12. The semiconductor assembly of claim 9, further comprising a diffusion barrier material between the insulating material and the monolithic via.

\* \* \* \* \*